(12) United States Patent
Nirschl

(10) Patent No.: US 7,692,949 B2
(45) Date of Patent: Apr. 6, 2010

(54) MULTI-BIT RESISTIVE MEMORY

(75) Inventor: Thomas Nirschl, Essex Junction, VT (US)

(73) Assignee: Qimonda North America Corp., Cary, NC (US)

(*) Notice: Subject to any disclaimer, the term of this patent is extended or adjusted under 35 U.S.C. 154(b) by 31 days.

(21) Appl. No.: 11/633,210

(22) Filed: Dec. 4, 2006

(65) Prior Publication Data
US 2008/0130351 A1    Jun. 5, 2008

(51) Int. Cl.
*G11C 11/00* (2006.01)
(52) U.S. Cl. .................... 365/148; 365/158; 365/163
(58) Field of Classification Search ........... 365/148, 365/163, 158, 171, 173
See application file for complete search history.

(56) References Cited

U.S. PATENT DOCUMENTS

| | | | |
|---|---|---|---|
| 5,687,112 A * | 11/1997 | Ovshinsky | 365/163 |
| 5,825,046 A * | 10/1998 | Czubatyj et al. | 365/163 |
| 5,933,365 A * | 8/1999 | Klersy et al. | 365/163 |
| 6,545,907 B1 * | 4/2003 | Lowrey et al. | 365/163 |
| 6,625,054 B2 * | 9/2003 | Lowrey et al. | 365/163 |
| 6,791,867 B2 * | 9/2004 | Tran | 365/163 |
| 6,813,177 B2 * | 11/2004 | Lowrey et al. | 365/163 |
| 6,937,507 B2 * | 8/2005 | Chen | 365/163 |
| 6,963,501 B2 | 11/2005 | Shiga | |
| 6,996,660 B1 | 2/2006 | Moore et al. | |
| 7,092,286 B2 * | 8/2006 | Lowrey et al. | 365/163 |
| 7,149,108 B2 * | 12/2006 | Rinerson et al. | 365/163 |
| 7,177,181 B1 * | 2/2007 | Scheuerlein | 365/163 |
| 7,227,170 B2 * | 6/2007 | Ovshinsky | 365/163 |
| 7,308,067 B2 * | 12/2007 | Lowrey et al. | 365/163 |
| 7,324,365 B2 * | 1/2008 | Gruening-von Schwerin et al. | 365/163 |
| 2006/0145135 A1 | 7/2006 | Huang et al. | |

* cited by examiner

*Primary Examiner*—Trong Phan
(74) *Attorney, Agent, or Firm*—Dicke, Billig & Czaja, PLLC

(57) ABSTRACT

A memory includes a first multi-bit resistive memory cell and a single bit resistive memory cell. The single bit resistive memory cell is for storing a bit indicating whether data stored in the first multi-bit resistive memory cell is inverted.

38 Claims, 6 Drawing Sheets

STORING THREE DATA BITS PER MEMORY CELL ─300

| ORIGINAL STATE | ORIGINAL DATA | INVERTED DATA | NEW STATE | INVERT BIT |
|---|---|---|---|---|
| 1 | 000 | X | 1 | 0 |
| 2 | 001 | X | 2 | 0 |
| 3 | 010 | X | 3 | 0 |
| 4 | 011 | X | 4 | 0 |
| 5 | 100 | 011 | 4 | 1 |
| 6 | 101 | 010 | 3 | 1 |
| 7 | 110 | 001 | 2 | 1 |
| 8 | 111 | 000 | 1 | 1 |

Fig. 5

STORING FOUR DATA BITS PER MEMORY CELL ─350

| ORIGINAL STATE | ORIGINAL DATA | INVERTED DATA | NEW STATE | INVERT BIT |
|---|---|---|---|---|
| 1 | 0000 | X | 1 | 0 |
| 2 | 0001 | X | 2 | 0 |
| 3 | 0010 | X | 3 | 0 |
| 4 | 0011 | X | 4 | 0 |
| 5 | 0100 | X | 5 | 0 |
| 6 | 0101 | X | 6 | 0 |
| 7 | 0110 | X | 7 | 0 |
| 8 | 0111 | X | 8 | 0 |
| 9 | 1000 | 0111 | 8 | 1 |
| 10 | 1001 | 0110 | 7 | 1 |
| 11 | 1010 | 0101 | 6 | 1 |
| 12 | 1011 | 0100 | 5 | 1 |
| 13 | 1100 | 0011 | 4 | 1 |
| 14 | 1101 | 0010 | 3 | 1 |
| 15 | 1110 | 0001 | 2 | 1 |
| 16 | 1111 | 0000 | 1 | 1 |

Fig. 6

MULTI-BIT RESISTIVE MEMORY

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. Cells in such intermediate states have a resistance that lies between the fully crystalline state and the fully amorphous state. If the phase change memory cell is programmed to one of three different resistance levels, 1.5 bits of data per cell can be stored. If the phase change memory cell is programmed to one of four different resistance levels, two bits of data per cell can be stored. If the phase change memory cell is programmed to one of eight resistance levels, three bits of data per cell can be stored. If the phase change memory cell is programmed to one of 16 resistance levels, four bits of data per cell can be stored, and so on.

Typically, there is a wide distribution of resistance values of a phase change memory cell in the two or more resistance states. The time to read the value of a phase change memory cell may be significantly long due to the high resistance of the amorphous state or intermediate states of the phase change material. This significantly long read time leads to slow overall memory operation.

For these and other reasons, there is a need for the present invention.

SUMMARY

One embodiment of the present invention provides a memory. The memory includes a first multi-bit resistive memory cell and a single bit resistive memory cell. The single bit resistive memory cell is for storing a bit indicating whether data stored in the first multi-bit resistive memory cell is inverted.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 is a table illustrating one embodiment of memory cell values for storing three data bits per memory cell.

FIG. 6 is a table illustrating one embodiment of memory cell values for storing four data bits per memory cell.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
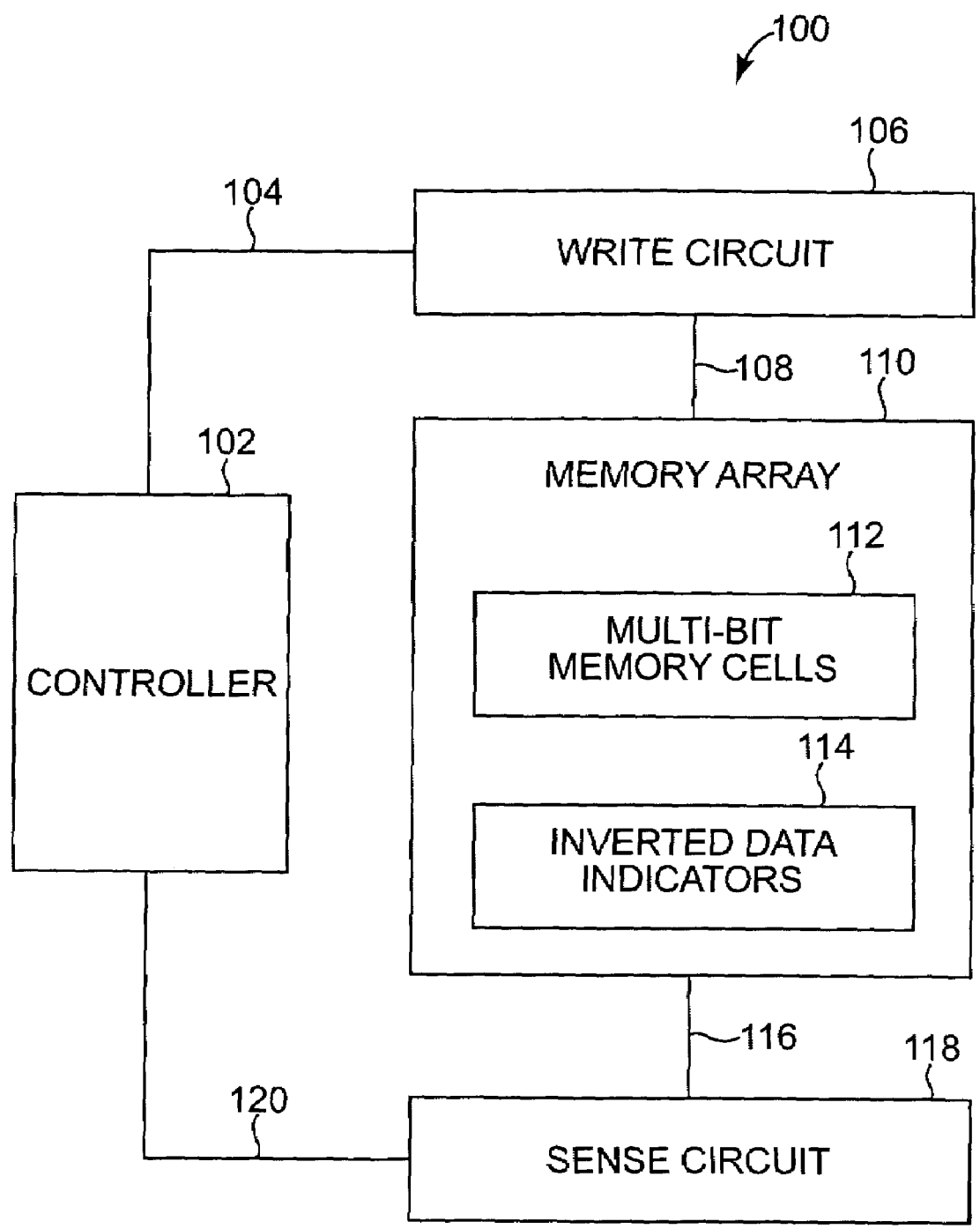
FIG. 1 is a block diagram illustrating one embodiment of a memory device.

FIG. 1 is a block diagram illustrating one embodiment of a memory device 100. Memory device 100 includes a controller 102, a write circuit 106, a memory array 110, and a sense circuit 118. Memory array 110 includes multi-bit memory cells 112 and inverted data indicators 114. In one embodiment, inverted data indicators 114 are single bit memory cells. In another embodiment, inverted data indicators 114 are multi-bit memory cells. In one embodiment, each of the multi-bit memory cells 112 and each of the inverted data indicators 114 are phase change memory cells that store data based on the amorphous and crystalline states of phase change material in the memory cell.

In one embodiment, each of the inverted data indicators 114 can be programmed into one of two states by programming the phase change material to one of the amorphous and crystalline states. In another embodiment, each of the inverted data indicators 114 can be programmed into one of three or more state by programming the phase change material to have intermediate resistance values. Each of the multi-bit memory cells 112 can also be programmed into one of three or more states by programming the phase change material to have intermediate resistance values. To program one of multi-bit memory cells 112 or one of inverted data indicators 114 to an intermediate resistance value, the amount of crystalline material coexisting with amorphous material, and hence the cell resistance, is controlled using a suitable write strategy.

In one embodiment, multi-bit memory cells 112 store data in the lower half of the available resistance states. For example, if each multi-bit memory cell 112 stores three data bits, which corresponds to eight resistance states, the lower four resistance states are used. If each multi-bit memory cell 112 stores four data bits, which corresponds to 16 resistance states, the lower eight resistance states are used. The number of resistance states used is reduced by one half by inverting any data that would have been stored in the upper half of the available resistance states and storing the inverted data in the lower half of the available resistance states. By storing the data in the lower half of the available resistance states, the access times for reading the memory cells are reduced. In one embodiment, each inverted data indicator 114 provides an inversion data bit indicating whether the data stored in a multi-bit memory cell 112 is inverted. In another embodiment, each inverted data indicator 114 provides two or more inversion data bits indicating whether the data stored in two or more respective multi-bit memory cells 112 is inverted.

In one embodiment a group of multi-bit memory cells 112, such as all multi-bit memory cells 112 along a single bit line, are associated with an inverted data indicator 114. In one embodiment, the inverted data indicator 114 is a single bit memory cell that indicates whether all the data stored within the group of multi-bit memory cells 112 is inverted. In this embodiment, up to 50% of the multi-bit memory cells 112 in the group may include data stored in the upper half of the available resistance states. This is a reduction of 50% from the possible 100% of multi-bit memory cells 112 that could include data stored in the upper half of the available resistance states if no data were inverted. In another embodiment, the inverted data indicator 114 is a multi-bit memory cell that indicates whether the data stored within each respective multi-bit memory cell 112 within the group of multi-bit memory cells 112 is inverted. In this embodiment, the upper half of the available resistance states of the multi-bit memory cells 112 is not used.

In another embodiment, each multi-bit memory cell 112 is paired with an inverted data indicator 114. In this embodiment, each inverted data indicator 114 is a single bit memory cell that indicates whether the data stored in the multi-bit memory cell 112 is inverted. In this embodiment, the upper half of the available resistance states of the multi-bit memory cells 112 is not used.

As used herein, the term "electrically coupled" is not meant to mean that the elements must be directly coupled together and intervening elements may be provided between the "electrically coupled" elements.

Controller 102 is electrically coupled to write circuit 106 through signal path 104 and to sense circuit 118 through signal path 120. Write circuit 106 is electrically coupled to memory array 110 though signal path 108. Memory array 110 is electrically coupled to sense circuit 118 through signal path 116.

In one embodiment, each of the multi-bit memory cells 112 and each of the inverted data indicators 114 include a phase change material that may be changed from an amorphous state to a crystalline state or from a crystalline state to an amorphous state under the influence of temperature change. In one embodiment, where each inverted data indicator 114 is a single bit memory cell, the crystalline and amorphous phase change material in one of the single bit memory cells thereby defines two states for storing inversion data within memory array 110. In another embodiment, where each inverted data indicator 114 is a multi-bit memory cell, the amount of crystalline phase change material coexisting with amorphous phase change material in one of the multi-bit memory cells thereby defines three or more state for storing inversion data within memory array 110. The amount of crystalline phase change material coexisting with amorphous phase change material in one of multi-bit memory cells 112 thereby defines three or more states for storing data within memory array 110.

In the amorphous state, a phase change material exhibits significantly higher resistivity than in the crystalline state. Therefore, the two or more states of inverted data indicators 114 and the three or more states of multi-bit memory cells 112 differ in their electrical resistivity. In one embodiment, inverted data indicators 114 are single bit memory cells that include two states and a binary system is used, wherein the two states are assigned bit values of "0" and "1". In another embodiment, inverted data indicators 114 are multi-bit memory cells that include four states, wherein the four states are assigned bit values of "00", "01", "10", and "11". In other embodiments, the inverted data indicators 114 can include any suitable number of states. In one embodiment, multi-bit memory cells 112 include eight states, where only the lower four states are used and are assigned multi-bit values, such as "000", "001", "010", and "011". Multi-bit values, such as "100", "101" "110", and "111" are inverted and stored as "011" "010", "001", and "000", respectively. In other embodiments, the three or more states of multi-bit memory cells 112 can be any suitable number of states in the phase change material of a multi-bit memory cell. In one embodiment, inverted data indicators 114 are multi-bit memory cells that store fewer bits than multi-bit memory cells 112.

Controller 102 includes a microprocessor, microcontroller, or other suitable logic circuitry for controlling the operation of memory circuit 100. Controller 102 controls read and write operations of memory circuit 100 including the application of control and data signals to memory array 110 through write circuit 106 and sense circuit 118. In one embodiment, write circuit 106 provides voltage pulses through signal path 108 to multi-bit memory cells 112 and inverted data indicators 114 to program the memory cells. In other embodiments, write circuit 106 provides current pulses through signal path 108 to multi-bit memory cells 112 and inverted data indicators 114 to program the memory cells.

Sense circuit 118 reads each of the two or more states of the inverted data indicators 114 and each of the three or more states of the multi-bit memory cells 112 through signal path 116. In one embodiment, to read the resistance of one of the inverted data indicators 114 or one of the multi-bit memory cells 112, sense circuit 118 provides current that flows through one of the inverted data indicators 114 or one of the multi-bit memory cells 112. Sense circuit 118 then reads the voltage across that one of the inverted data indicators 114 or that one of the multi-bit memory cells 112. In one embodiment, sense circuit 118 provides voltage across one of the inverted data indicators 114 or one of the multi-bit memory cells 112 and reads the current that flows through that one of the inverted data indicators 114 or that one of the multi-bit memory cells 112. In one embodiment, write circuit 106 provides voltage across one of the inverted data indicators 114 or one of the multi-bit memory cells 112 and sense circuit 118 reads the current that flows through that one of the inverted data indicators 114 or that one of the multi-bit memory cells 112. In one embodiment, write circuit 106 provides current that flows through one of the inverted data indicators 114 or one of the multi-bit memory cells 112 and sense circuit 118 reads the voltage across that one of the inverted data indicators 114 or that one of the multi-bit memory cells 112.

To program an inverted data indicator 114 within memory device 100, write circuit 106 generates a current or voltage pulse for heating the phase change material in the target memory cell. In one embodiment, write circuit 106 generates an appropriate current or voltage pulse, which is distributed to the appropriate target inverted data indicator 114. The current or voltage pulse amplitude and duration is controlled depending on whether the memory cell is being set or reset. Generally, a "set" operation of an inverted data indicator is heating the phase change material of the target memory cell above its crystallization temperature (but below its melting temperature) long enough to achieve the crystalline state or a partially crystalline and partially amorphous state. Generally, a "reset" operation of an inverted data indicator is heating the phase change material of the target memory cell above its melting temperature, and then quickly quench cooling the material, thereby achieving the amorphous state or a partially amorphous and partially crystalline state.

To program a multi-bit memory cell 112 within memory device 100, write circuit 106 generates a current or voltage pulse for heating the phase change material in the target memory cell. In one embodiment, write circuit 106 generates an appropriate current or voltage pulse, which is distributed to the appropriate target multi-bit memory cell 112. The current or voltage pulse amplitude and duration is controlled depending on whether the memory cell is being set or reset. Generally, a "set" operation of a multi-bit memory cell is heating the phase change material of the target memory cell above its crystallization temperature (but below its melting temperature) long enough to achieve the crystalline state or a partially crystalline and partially amorphous state. Generally, a "reset" operation of a multi-bit memory cell is heating the phase change material of the target memory cell above its melting temperature, and then quickly quench cooling the material, thereby achieving the amorphous state or a partially amorphous and partially crystalline state.

Figure 2:
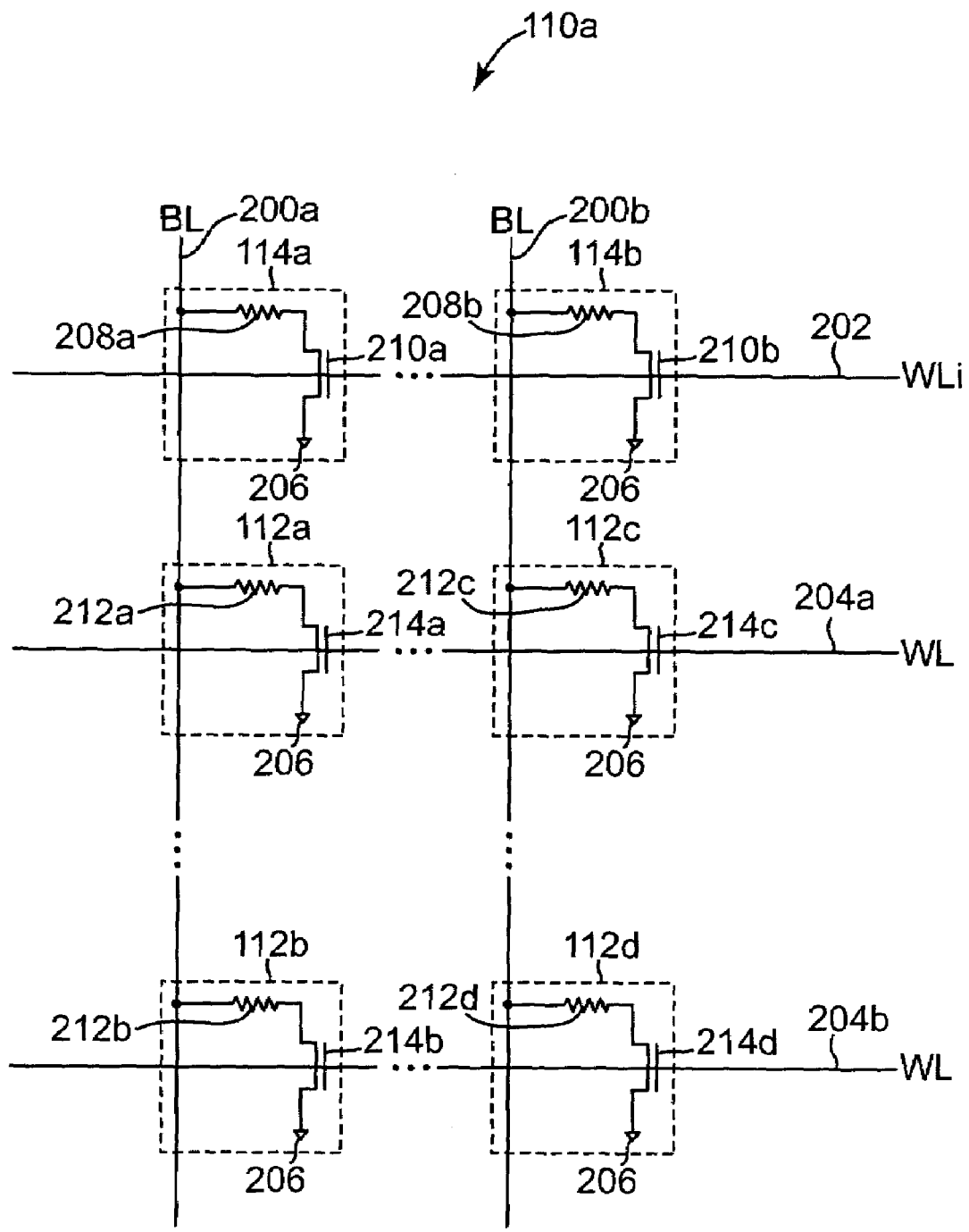
FIG. 2 is a schematic diagram illustrating one embodiment of a memory array.

FIG. 2 is a schematic diagram illustrating one embodiment of a memory array 110a. In one embodiment, memory array 110 is similar to memory array 110a. Memory array 110a includes inverted data indicators 114a-114b, multi-bit phase change memory cells 112a-112d, a plurality of bit lines (BLs) 200a-200b (collectively referred to as bit lines 200), a word line (WLi) for inverted data indicators 114a-114b, and a plurality of word lines (WLs) 204a-204b (collectively referred to as word lines 204) for multi-bit memory cells 112a-112d.

Each inverted data indicator 114a-114b and each multi-bit phase change memory cell 112a-112d stores data based on the amorphous and crystalline states of phase change material in the memory cell. In one embodiment, each inverted data indicator 114a-114b is a single bit memory cell that can be programmed into two states by programming the phase change material to the crystalline state or to the amorphous state. In another embodiment, each inverted data indicator 114a-114b is a multi-bit memory cell that can be programmed into three or more states by programming the phase change material to have intermediate resistance values. Each multi-bit memory cell 112a-112d can be programmed into three or more states by programming the phase change material to have intermediate resistance values. To program one of multi-bit memory cells 112a-112d to an intermediate resistance value, the amount of crystalline material coexisting with amorphous material, and hence the cell resistance, is controlled via a suitable write strategy.

Each inverted data indicator 114 is electrically coupled to word line 202, a bit line 200, and common or ground 206. Inverted data indicator 114a is electrically coupled to bit line 200a, word line 202, and common or ground 206. Inverted data indicator 114b is electrically coupled to bit line 200b, word line 202, and common or ground 206.

Each inverted data indicator 114 includes a phase change element 208 and a transistor 210. While transistor 210 is a field-effect transistor (FET) in the illustrated embodiment, in other embodiments, transistor 210 can be other suitable devices such as a bipolar transistor or a 3D transistor structure. In other embodiments, a diode-like structure may be used in place of transistor 210. Inverted data indicator 114a includes phase change element 208a and transistor 210a. One side of phase change element 208a is electrically coupled to bit line 200a, and the other side of phase change element 208a is electrically coupled to one side of the source-drain path of transistor 210a. The other side of the source-drain path of transistor 210a is electrically coupled to common or ground 206. The gate of transistor 210a is electrically coupled to word line 202.

Inverted data indicator 114b includes phase change element 208b and transistor 210b. One side of phase change element 208b is electrically coupled to bit line 200b, and the other side of phase change element 208b is electrically coupled to one side of the source-drain path of transistor 210b. The other side of the source-drain path of transistor 210b is electrically coupled to common or ground 206. The gate of transistor 210b is electrically coupled to word line 202.

In another embodiment, each phase change element 208a is electrically coupled to common or ground 206 and each transistor 210 is electrically coupled to a bit line 200. For example, for inverted data indicator 114a, one side of phase change element 208a is electrically coupled to common or ground 206. The other side of phase change element 208a is electrically coupled to one side of the source-drain path of transistor 210a. The other side of the source-drain path of transistor 210a is electrically coupled to bit line 200a.

Each multi-bit phase change memory cell 112 is electrically coupled to a word line 204, a bit line 200, and common or ground 206. Phase change memory cell 112a is electrically coupled to bit line 200a, word line 204a, and common or ground 206, and phase change memory cell 112b is electrically coupled to bit line 200a, word line 204b, and common or ground 206. Phase change memory cell 112c is electrically coupled to bit line 200b, word line 204a, and common or ground 206, and phase change memory cell 112d is electrically coupled to bit line 200b, word line 204b, and common or ground 206.

Each phase change memory cell 112 includes a phase change element 212 and a transistor 214. While transistor 214 is a FET in the illustrated embodiment, in other embodiments, transistor 214 can be other suitable devices such as a bipolar transistor or a 3D transistor structure. In other embodiments, a diode-like structure may be used in place of transistor 214. Phase change memory cell 112a includes phase change element 212a and transistor 214a. One side of phase change element 212a is electrically coupled to bit line 200a, and the other side of phase change element 212a is electrically coupled to one side of the source-drain path of transistor 214a. The other side of the source-drain path of transistor 214a is electrically coupled to common or ground 206. The gate of transistor 214a is electrically coupled to word line 204a.

Phase change memory cell 112b includes phase change element 212b and transistor 214b. One side of phase change element 212b is electrically coupled to bit line 200a, and the other side of phase change element 212b is electrically coupled to one side of the source-drain path of transistor 214b. The other side of the source-drain path of transistor 214b is electrically coupled to common or ground 206. The gate of transistor 214b is electrically coupled to word line 204b.

Phase change memory cell 112c includes phase change element 212c and transistor 214c. One side of phase change element 212c is electrically coupled to bit line 200b, and the other side of phase change element 212c is electrically coupled to one side of the source-drain path of transistor 214c. The other side of the source-drain path of transistor 214c is electrically coupled to common or ground 206. The gate of transistor 214c is electrically coupled to word line 204a.

Phase change memory cell 112d includes phase change element 212d and transistor 214d. One side of phase change element 212d is electrically coupled to bit line 200b, and the other side of phase change element 212d is electrically coupled to one side of the source-drain path of transistor 214d. The other side of the source-drain path of transistor 214d is electrically coupled to common or ground 206. The gate of transistor 214d is electrically coupled to word line 204b.

In another embodiment, each phase change element 212 is electrically coupled to common or ground 206 and each transistor 214 is electrically coupled to a bit line 200. For example, for phase change memory cell 112a, one side of phase change element 212a is electrically coupled to common or ground 206. The other side of phase change element 212a is electrically coupled to one side of the source-drain path of transistor 214a. The other side of the source-drain path of transistor 214a is electrically coupled to bit line 200a.

The phase change material of phase change elements 208 and 212 may be made up of a variety of materials in accordance with the present invention. Generally, chalcogenide alloys that contain one or more elements from group VI of the periodic table are useful as such materials. In one embodiment, the phase change material of phase change elements 208 and 212 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

In one embodiment, inverted data indicator 114a is a single bit memory cell that stores a single data bit in phase change element 208a indicating whether the data stored in the multi-bit memory cells 112a-112b along bit line 200a is inverted. Inverted data indicator 114b stores a single data bit in phase change element 208b indicating whether the data stored in the multi-bit memory cells 112c-112d along bit line 200b is inverted. In this embodiment, controller 102 determines whether to invert the data to be stored in the multi-bit memory cells 112 along a bit line 200 so that the number of multi-bit memory cells 112 storing data in the upper half of the available resistance states is less than or equal to the number of multi-bit memory cells 112 storing data in the lower half of the available resistance states.

In another embodiment, inverted data indicator 114a is a multi-bit memory cell that stores more than one data bit in phase change element 208a indicating whether the data stored in each respective multi-bit memory cell 112a-112b along bit line 200a is inverted. Inverted data indicator 114b stores more than one data bit in phase change element 208b indicating whether the data stored in each respective multi-bit memory cell 112c-112d along bit line 200b is inverted. In this embodiment, controller 102 determines whether to invert data to be stored in multi-bit memory cells 112 along a bit line 200 so that no data is stored in the upper half of available resistance states.

Sense circuit 118 reads the states of inverted data indicators 114a-114b and multi-bit memory cells 112a-112d through bit lines 200a-200b. In one embodiment, to read the resistance of one of the memory cells 114a-114b or 112a-112d sense circuit 118 provides current that flows through one of the memory cells 114a-114b or 112a-112d through a bit line 200a-200b with the word line 202 or 204 for the memory cell selected. Sense circuit 118 then reads the voltage across that one of the memory cells 114a-114b or 112a-112d to determine the resistance state. In another embodiment, sense circuit 118 provides voltage across one of the memory cells 114a-114b or 112a-112d through a bit line 200a-200b with the word line 202 or 204 for the memory cell selected. Sense circuit 118 then reads the current through that one of the memory cells 114a-114b or 112a-112d to determine the resistance state.

Sense circuit 118 reads the state of the inverted data indicators 114a-114b for a bit line 200a-200b each time a multi-bit memory cell 112a-112d along the same bit line 200a-200b is read. Sense circuit 118 sets the reference level of a sense amplifier coupled to the selected bit line 200a-200b to a first level for sensing the state of the inverted data indicator 114a-114b and to a second level for sensing the state of the multi-bit memory cells 112a-112d.

In the following embodiment, inverted data indicators 114a-114b are single bit memory cells. In response to phase change element 208a of single bit memory cell 114a being set to "0", the data read from phase change elements 212a-212b of multi-bit memory cells 112a-112b is not inverted before being passed to an external circuit. In response to phase change element 208a of single bit memory cell 114a being set to "1", the data read from phase change elements 212a-212b of multi-bit memory cells 112a-112b is inverted before being passed to an external circuit. In response to phase change element 208b of single bit memory cell 114b being set to "0", the data read from phase change elements 212c-212d of multi-bit memory cells 112c-112d is not inverted before being passed to an external circuit. In response to phase change element 208b of single bit memory cell 114b being set to "1", the data read from phase change elements 212c-212d of multi-bit memory cells 112c-112d is inverted before being passed to an external circuit. In another embodiment, a "1" stored in a single bit memory cell 114a-114b indicates the data stored in the associated multi-bit memory cells 112a-112d is not inverted, and a "0" stored in a single bit memory cell 114a-114b indicates the data stored in the associated multi-bit memory cells 112a-112d is inverted.

In the following embodiment, inverted data indicators 114a-114b are multi-bit memory cells. In response to phase change element 208a of multi-bit memory cell 114a being set to "00", the data read from phase change element 212a of multi-bit memory cell 112a is not inverted and the data read from phase change element 212b of multi-bit memory cell 112b is not inverted before being passed to an external circuit. In response to phase change element 208a of multi-bit memory cell 114a being set to "01", the data read from phase change element 212a of multi-bit memory cell 112a is not inverted and the data read from phase change element 212b of multi-bit memory cell 112b is inverted before being passed to an external circuit. In response to phase change element 208a of multi-bit memory cell 114a being set to "10", the data read from phase change element 212a of multi-bit memory cell 112a is inverted and the data read from phase change element 212b of multi-bit memory cell 112b is not inverted before being passed to an external circuit. In response to phase change element 208a of multi-bit memory cell 114a being set to "11", the data read from phase change element 212a of multi-bit memory cell 112a is inverted and the data read from phase change element 212b of multi-bit memory cell 112b is inverted before being passed to an external circuit. Multi-bit memory cell 114b is used similarly to multi-bit memory cell 114a for multi-bit memory cells 112c and 112d along bit line 200b. In another embodiment, a "11" stored in a multi-bit memory cell 114 indicates the data stored in the associated multi-bit memory cells 112 is not inverted, and a "00" stored in a multi-bit memory cell 114 indicates the data stored in the associated multi-bit memory cells 112 is inverted.

During a set operation of inverted data indicator 114a, a set current or voltage pulse is selectively enabled and sent through bit line 200a to phase change element 208a thereby heating it above its crystallization temperature (but usually below its melting temperature) with word line 202 selected to activate transistor 210a. In this way, phase change element 208a reaches the crystalline state or a partially crystalline and partially amorphous state during this set operation. During a reset operation of inverted data indicator 114a, a reset current or voltage pulse is selectively enabled and sent through bit line 200a to phase change element 208a. The reset current or voltage quickly heats phase change element 208a above its melting temperature. After the current or voltage pulse is turned off, phase change element 208a quickly quench cools into the amorphous state or a partially amorphous and partially crystalline state. Inverted data indicator 114b and other inverted data indicators 114 in memory array 110a are set and reset similarly to inverted data indicator 114a using a similar current or voltage pulse.

During a set operation of multi-bit phase change memory cell 112a, a set current or voltage pulse is selectively enabled and sent through bit line 200a to phase change element 212a thereby heating it above its crystallization temperature (but usually below its melting temperature) with word line 204a selected to activate transistor 214a. In this way, phase change element 212a reaches its crystalline state or a partially crystalline and partially amorphous state during this set operation. During a reset operation of phase change memory cell 112a, a reset current or voltage pulse is selectively enabled and sent through bit line 200a to phase change element 212a. The reset current or voltage quickly heats phase change element 212a above its melting temperature. After the current or voltage pulse is turned off, phase change element 212a quickly quench cools into the amorphous state or a partially amorphous and partially crystalline state. Phase change memory cells 112b-112d and other phase change memory cells 112 in memory array 110a are set and reset similarly to phase change memory cell 112a using a similar current or voltage pulse.

Figure 3:
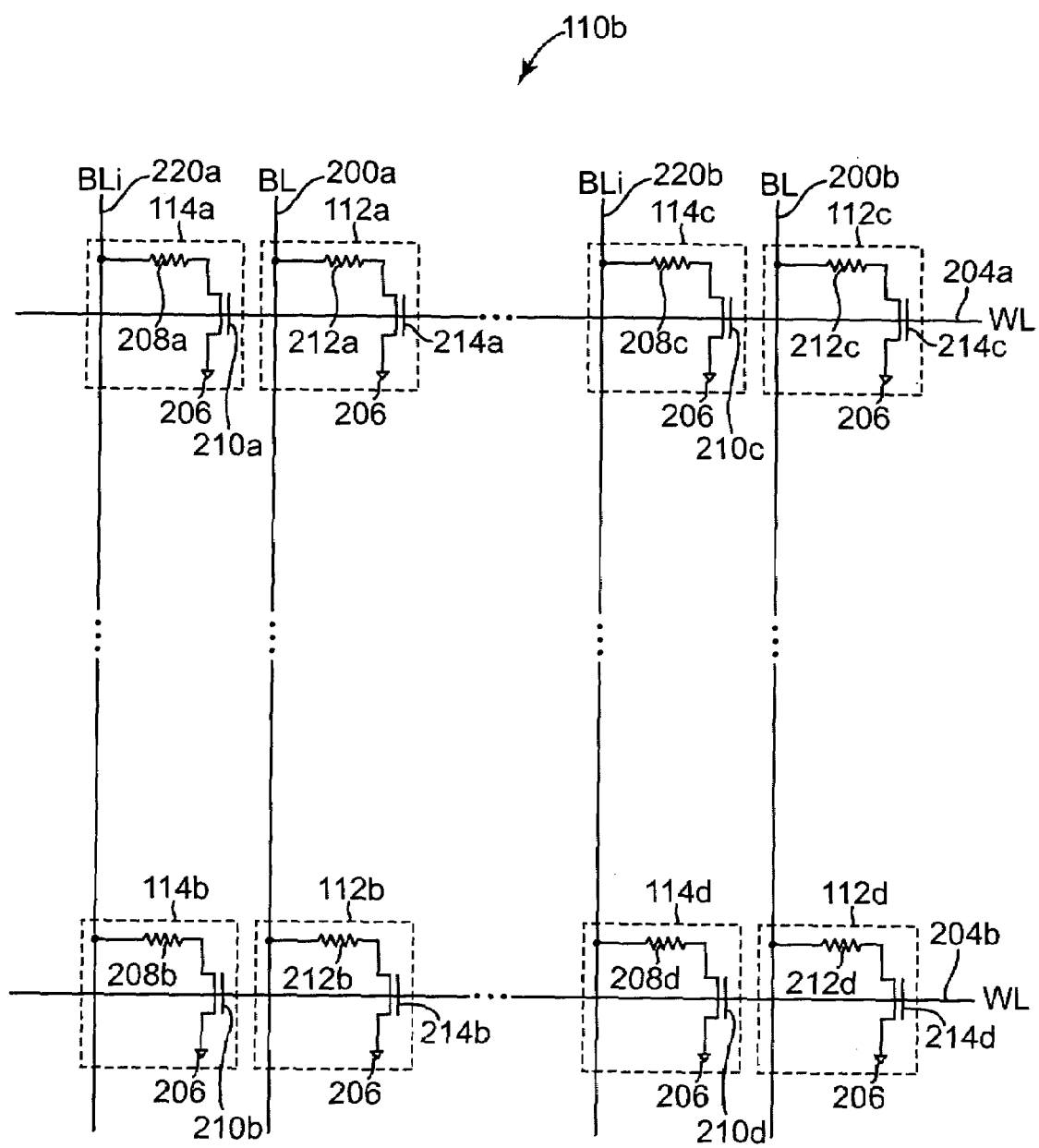
FIG. 3 is a schematic diagram illustrating another embodiment of a memory array.

FIG. 3 is a schematic diagram illustrating another embodiment of a memory array 110b. In one embodiment, memory array 110 is similar to memory array 110b. Memory array 110b includes inverted data indicators 114a-114d, multi-bit phase change memory cells 112a-112d, a plurality of inverted data indicator bit lines (BLi) 220a-220b, a plurality of multi-bit memory cell bit lines (BLs) 200a-200b, and a plurality of word lines (WLs) 204a-204b.

Each inverted data indicator 114 is electrically coupled to a word line 204, a bit line 220, and common or ground 206. Inverted data indicator 114a is electrically coupled to bit line 220a, word line 204a, and common or ground 206. Inverted data indicator 114b is electrically coupled to bit line 220a, word line 204b, and common or ground 206. Inverted data indicator 114c is electrically coupled to bit line 220b, word line 204a, and common or ground 206. Inverted data indicator 114d is electrically coupled to bit line 220b, word line 204b, and common or ground 206. Each multi-bit phase change memory cell 112 is configured as previously described and illustrated with reference to FIG. 2.

Each inverted data indicator 114 includes a phase change element 208 and a transistor 210. Inverted data indicator 114a includes phase change element 208a and transistor 210a. One side of phase change element 208a is electrically coupled to bit line 220a, and the other side of phase change element 208a is electrically coupled to one side of the source-drain path of transistor 210a. The other side of the source-drain path of transistor 210a is electrically coupled to common or ground 206. The gate of transistor 210a is electrically coupled to word line 204a.

Inverted data indicator 114b includes phase change element 208b and transistor 210b. One side of phase change element 208b is electrically coupled to bit line 220a, and the other side of phase change element 208b is electrically coupled to one side of the source-drain path of transistor 210b. The other side of the source-drain path of transistor 210b is electrically coupled to common or ground 206. The gate of transistor 210b is electrically coupled to word line 204b.

Inverted data indicator 114c includes phase change element 208c and transistor 210c. One side of phase change element 208c is electrically coupled to bit line 220b, and the other side of phase change element 208c is electrically coupled to one side of the source-drain path of transistor 210c. The other side of the source-drain path of transistor 210c is electrically coupled to common or ground 206. The gate of transistor 210c is electrically coupled to word line 204a.

Inverted data indicator 114d includes phase change element 208d and transistor 210d. One side of phase change element 208d is electrically coupled to bit line 220b, and the other side of phase change element 208d is electrically coupled to one side of the source-drain path of transistor 210d. The other side of the source-drain path of transistor 210*d* is electrically coupled to common or ground 206. The gate of transistor 210*d* is electrically coupled to word line 204*b*.

In another embodiment, each phase change element 208 is electrically coupled to common or ground 206 and each transistor 210 is electrically coupled to a bit line 220. For example, for inverted data indicator 114*a*, one side of phase change element 208*a* is electrically coupled to common or ground 206. The other side of phase change element 208*a* is electrically coupled to one side of the source-drain path of transistor 210*a*. The other side of the source-drain path of transistor 210*a* is electrically coupled to bit line 220*a*.

In one embodiment, each inverted data indicator 114 is a single bit memory cell that stores a single data bit indicating whether the data stored in the associated multi-bit memory cell 112 is inverted. Single bit memory cell 114*a* stores a single data bit in phase change element 208*a* indicating whether the data stored in phase change element 212*a* of multi-bit memory cell 112*a* is inverted. Single bit memory cell 114*b* stores a single data bit in phase change element 208*b* indicating whether the data stored in phase change element 212*b* of multi-bit memory cell 112*b* is inverted. Single bit memory cell 114*c* stores a single data bit in phase change element 208*c* indicating whether the data stored in phase change element 212*c* of multi-bit memory cell 112*c* is inverted. Single bit memory cell 114*d* stores a single data bit in phase change element 208*d* indicating whether the data stored in phase change element 212*d* of multi-bit memory cell 112*d* is inverted. Controller 102 determines whether to invert the data to be stored in each multi-bit memory cell 112 so that the data is stored in the lower half of the available resistance states within each memory cell 112.

In another embodiment, each inverted data indicator 114 is a multi-bit memory cell that stores more than one data bit indicating whether the data stored in more than one respective associated multi-bit memory cell 112 is inverted. For example, multi-bit memory cell 114*a* can store two bits. The first bit can indicate whether the data stored in multi-bit memory cell 112*a* is inverted. The second bit can indicate whether the data stored in multi-bit memory cell 112*c* is inverted. In this embodiment, inverted data indicator 114*c* and bit line 220*b* can be eliminated since they are not used.

Sense circuit 118 reads the states of inverted data indicators 114*a*-114*d* through bit lines 220*a*-220*b*. Sense circuit 118 reads the states of multi-bit memory cells 112*a*-112*d* through bit lines 200*a*-200*b*. In one embodiment, to read the resistance of one of the inverted data indicators 114*a*-114*d* sense circuit 118 provides current that flows through one of the memory cells 114*a*-114*d* through a bit line 220*a*-220*b* with the word line 204 for the memory cell selected. Sense circuit 118 then reads the voltage across that one of the memory cells 114*a*-114*b* to determine the resistance state. In another embodiment, sense circuit 118 provides voltage across one of the memory cells 114*a*-114*d* through a bit line 220*a*-220*b* with the word line 204 for the memory cell selected. Sense circuit 118 then reads the current through that one of the memory cells 114*a*-114*b* to determine the resistance state.

In one embodiment, to read the resistance of one of the multi-bit memory cells 112*a*-112*d*, sense circuit 118 provides current that flows through one of the memory cells 112*a*-112*d* through a bit line 200*a*-200*b* with the word line 204 for the memory cell selected. Sense circuit 118 then reads the voltage across that one of the memory cells 112*a*-112*d* to determine the resistance state. In another embodiment, sense circuit 118 provides voltage across one of the memory cells 112*a*-112*d* through a bit line 200*a*-200*b* with the word line 204 for the memory cell selected. Sense circuit 118 then reads the current through that one of the memory cells 112*a*-112*d* to determine the resistance state.

Sense circuit 118 reads the state of an inverted data indicator 114*a*-114*d* each time an associated multi-bit memory cell 112*a*-112*d* is read. Sense circuit 118 sets the reference levels of sense amplifiers coupled to bit lines 220*a*-220*b* to a first level for sensing the state of the inverted data indicators 114*a*-114*d*. Sense circuit 118 sets the reference levels of sense amplifiers coupled to bit lines 200*a*-200*b* to a second level for sensing the state of the multi-bit memory cells 112*a*-112*d*.

In the following embodiment, inverted data indicators 114*a*-114*d* are single bit memory cells. In response to phase change element 208*a* of single bit memory cell 114*a* being set to "0", the data read from phase change element 212*a* of multi-bit memory cell 112*a* is not inverted before being passed to an external circuit. In response to phase change element 208*a* of single bit memory cell 114*a* being set to "1", the data read from phase change element 212*a* of multi-bit memory cell 112*a* is inverted before being passed to an external circuit. In response to phase change element 208*b* of single bit memory cell 114*b* being set to "0", the data read from phase change element 212*b* of multi-bit memory cell 112*b* is not inverted before being passed to an external circuit. In response to phase change element 208*b* of single bit memory cell 114*b* being set to "1", the data read from phase change element 212*b* of multi-bit memory cell 112*b* is inverted before being passed to an external circuit.

In response to phase change element 208*c* of single bit memory cell 114*c* being set to "0", the data read from phase change element 212*c* of multi-bit memory cell 112*c* is not inverted before being passed to an external circuit. In response to phase change element 208*c* of single bit memory cell 114*c* being set to "1", the data read from phase change element 212*c* of multi-bit memory cell 112*c* is inverted before being passed to an external circuit. In response to phase change element 208*d* of single bit memory cell 114*d* being set to "0", the data read from phase change element 212*d* of multi-bit memory cell 112*d* is not inverted before being passed to an external circuit. In response to phase change element 208*d* of single bit memory cell 114*d* being set to "1", the data read from phase change element 212*d* of multi-bit memory cell 112*d* is inverted before being passed to an external circuit. In another embodiment, a "1" stored in a single bit memory cell 114*a*-114*d* indicates the data stored in the associated multi-bit memory cell 112*a*-112*d* is not inverted, and a "0" stored in a single bit memory cell 114*a*-114*d* indicates the data stored in the associated multi-bit memory cell 112*a*-112*d* is inverted.

In the following embodiment, inverted data indicators 114*a*-114*d* are multi-bit memory cells and inverted data indicators 114*c*-114*d* and bit line 220*b* are excluded. In response to phase change element 208*a* of multi-bit memory cell 114*a* being set to "00", the data read from phase change element 212*a* of multi-bit memory cell 112*a* is not inverted and the data read from phase change element 212*c* of multi-bit memory cell 112*c* is not inverted before being passed to an external circuit. In response to phase change element 208*a* of multi-bit memory cell 114*a* being set to "01", the data read from phase change element 212*a* of multi-bit memory cell 112*a* is not inverted and the data read from phase change element 212*c* of multi-bit memory cell 112*c* is inverted before being passed to an external circuit. In response to phase change element 208*a* of multi-bit memory cell 114*a* being set to "10", the data read from phase change element 212*a* of multi-bit memory cell 112*a* is inverted and the data read from phase change element 212c of multi-bit memory cell 112c is not inverted before being passed to an external circuit. In response to phase change element 208a of multi-bit memory cell 114a being set to "11", the data read from phase change element 212a of multi-bit memory cell 112a is inverted and the data read from phase change element 212c of multi-bit memory cell 112c is inverted before being passed to an external circuit. Multi-bit memory cell 114b is used similarly to multi-bit memory cell 114a for multi-bit memory cells 112b and 112d along word line 204b. In another embodiment, a "11" stored in a multi-bit memory cell 114 indicates the data stored in the associated multi-bit memory cells 112 is not inverted, and a "00" stored in a multi-bit memory cell 114 indicates the data stored in the associated multi-bit memory cells 112 is inverted.

During a set operation of inverted data indicator 114a, a set current or voltage pulse is selectively enabled and sent through bit line 220a to phase change element 208a thereby heating it above its crystallization temperature (but usually below its melting temperature) with word line 204a selected to activate transistor 210a. In this way, phase change element 208a reaches the crystalline state or a partially crystalline and partially amorphous state during this set operation. During a reset operation of inverted date indicator 114a, a reset current or voltage pulse is selectively enabled and sent through bit line 220a to phase change element 208a. The reset current or voltage quickly heats phase change element 208a above its melting temperature. After the current or voltage pulse is turned off, phase change element 208a quickly quench cools into the amorphous state or a partially amorphous and partially crystalline state. Inverted data indicators 114b-114d and other inverted data indicators 114 in memory array 110b are set and reset similarly to inverted data indicator 114a using a similar current or voltage pulse. Multi-bit phase change memory cells 112a-112d are set and reset as previously described and illustrated with reference to FIG. 2.

Figure 4:
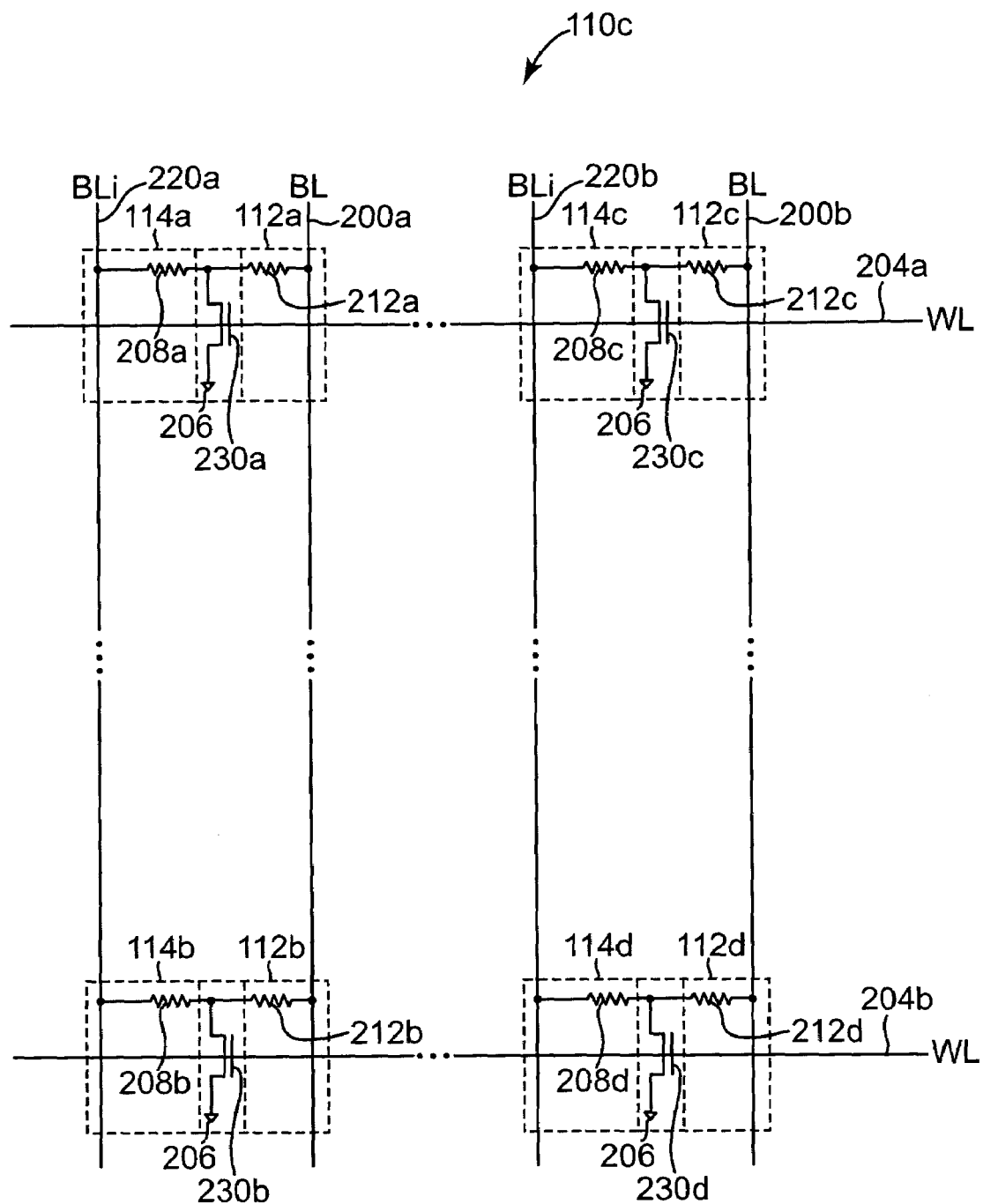
FIG. 4 is a schematic diagram illustrating another embodiment of a memory array.

FIG. 4 is a schematic diagram illustrating another embodiment of a memory array 110c. In one embodiment, memory array 110 is similar to memory array 110c. Memory array 110c includes single bit phase change memory cells 114a-114d, multi-bit phase change memory cells 112a-112d, a plurality of single bit memory cell bit lines (BLi) 220a-220b, a plurality of multi-bit memory cell bit lines (BLs) 200a-200b, and a plurality of word lines (WLs) 204a-204b. Memory array 110c is similar to memory array 110b previously described and illustrated with reference to FIG. 3, except that in memory array 110c each single bit memory cell 114 and multi-bit memory cell 112 pair share a single transistor.

Each single bit phase change memory cell 114 includes a phase change element 208 and a shared transistor 230. Each multi-bit phase change memory cell 112 includes a phase change element 212 and a shared transistor 230. While transistor 230 is a FET in the illustrated embodiment, in other embodiments, transistor 230 can be other suitable devices such as a bipolar transistor or a 3D transistor structure. In other embodiments, a diode-like structure may be used in place of transistor 230. Single bit memory cell 114a includes phase change element 208a and shared transistor 230a. Multi-bit memory cell 112a includes phase change element 212a and shared transistor 230a. One side of phase change element 208a is electrically coupled to bit line 220a, and the other side of phase change element 208a is electrically coupled to one side of phase change element 212a and one side of the source-drain path of transistor 230a. The other side of phase change element 212a is electrically coupled to bit line 200a. The other side of the source-drain path of transistor 230a is electrically coupled to common or ground 206. The gate of transistor 230a is electrically coupled to word line 204a.

Single bit memory cell 114b includes phase change element 208b and shared transistor 230b. Multi-bit memory cell 112b includes phase change element 212b and shared transistor 230b. One side of phase change element 208b is electrically coupled to bit line 220a, and the other side of phase change element 208b is electrically coupled to one side of phase change element 212b and one side of the source-drain path of transistor 230b. The other side of phase change element 212b is electrically coupled to bit line 200a. The other side of the source-drain path of transistor 230b is electrically coupled to common or ground 206. The gate of transistor 230b is electrically coupled to word line 204b.

Single bit memory cell 114c includes phase change element 208c and shared transistor 230c. Multi-bit memory cell 112c includes phase change element 212c and shared transistor 230c. One side of phase change element 208c is electrically coupled to bit line 220b, and the other side of phase change element 208c is electrically coupled to one side of phase change element 212c and one side of the source-drain path of transistor 230c. The other side of phase change element 212c is electrically coupled to bit line 200b. The other side of the source-drain path of transistor 230c is electrically coupled to common or ground 206. The gate of transistor 230c is electrically coupled to word line 204a.

Single bit memory cell 114d includes phase change element 208d and shared transistor 230d. Multi-bit memory cell 112d includes phase change element 212d and transistor 230d. One side of phase change element 208d is electrically coupled to bit line 220b, and the other side of phase change element 208d is electrically coupled to one side of phase change element 212d and one side of the source-drain path of transistor 230d. The other side of phase change element 212d is electrically coupled to bit line 200b. The other side of the source-drain path of transistor 230d is electrically coupled to common or ground 206. The gate of transistor 230d is electrically coupled to word line 204b.

Sense circuit 118 reads the states of single bit memory cells 114a-114d through bit lines 220a-220b. Sense circuit 118 reads the states of multi-bit memory cells 112a-112d through bit lines 200a-200b. In one embodiment, to read the resistance of one of the single bit memory cells 114a-114d and the associated multi-bit memory cell 112a-112d, sense circuit 118 provides current that flows through the selected one of the single bit memory cells 114a-114d through a bit line 220a-220b and the selected one of the multi-bit memory cells 112a-112d through a bit line 200a-200b with the word line 204 for the memory cell pair selected. Sense circuit 118 then reads the voltage across that one of the single bit memory cells 114a-114d and that one of the multi-bit memory cells 112a-112d to determine the resistance states of each memory cell. In another embodiment, sense circuit 118 provides voltage across one of the memory cells 114a-114d through a bit line 220a-220b and the associated multi-bit memory cell 112a-112d through a bit line 200a-200b with the word line 204 for the memory cell pair selected. Sense circuit 118 then reads the current through that one of the single bit memory cells 114a-114b and that one of the multi-bit memory cells 112a-112d to determine the resistance states of each memory cell.

Sense circuit 118 reads the state of the single bit memory cell 114a-114d each time an associated multi-bit memory cell 112a-112d is read. Sense circuit 118 sets the reference levels of sense amplifiers coupled to bit lines 220a-220b to a first level for sensing the state of the single bit memory cells 114a-114d. Sense circuit 118 sets the reference levels of sense amplifiers coupled to bit lines 200a-200b to a second level for sensing the state of the multi-bit memory cells 112a-112d.

Single bit memory cells 114a-114d store a single data bit indicating whether the data stored in the associated multi-bit memory cell 112a-112d is inverted. Single bit memory cells 114a-114d and multi-bit memory cells 112a-112d are set and reset as previously described and illustrated with reference to FIG. 3 except that a shared transistor 230 is used in place of transistors 210 and 214.

FIG. 5 is a table 300 illustrating one embodiment of memory cell values for storing three data bits per multi-bit memory cell 112 in memory array 110b or memory array 110c. Table 300 lists original available resistance states for storing three data bits without inverting any data, original data for all possible three bit data values, inverted data where applicable (X indicates data that is not inverted), new resistance states (which change for inverted data), and the bit stored in the associated single bit memory cell 114 indicating whether the data stored in the associated multi-bit memory cell 112 is inverted.

As indicated in table 300, original available resistance states 5-8 are replaced by resistance states 4-1, respectively, by inverting the data bits and setting the single bit memory cell 114 data to "1". In this way, the upper half of the available resistance states is not used. With the upper half of the available resistance states not being used, the data stored in multi-bit memory cells 112 can be accessed faster. In other embodiments, the original data assigned to each resistance state is different from the data illustrated as long as the original data assigned to resistance states 5-8 corresponds to data stored in resistance states 1-4 when inverted.

FIG. 6 is a table 350 illustrating one embodiment of memory cell values for storing four data bits per multi-bit memory cell 112 in memory array 110b or memory array 110c. Table 350 lists original available resistance states for storing four data bits without inverting any data, original data for all possible four bit data values, inverted data where applicable (X indicates data that is not inverted), new resistance states (which change for inverted data), and the bit stored in the associated single bit memory cell 114 indicating whether the data stored in the associated multi-bit memory cell 112 is inverted.

As indicated in table 350, original resistance states 9-16 are replaced by resistance states 8-1, respectively, by inverting the data bits and setting the single bit memory cell 114 data to "1". In this way, the upper half of the available resistance states is not used. With the upper half of the available resistance states not being used, the data stored in multi-bit memory cells 112 can be accessed faster. In other embodiments, the original data assigned to each resistance state is different from the data illustrated as long as the original data assigned to resistance states 9-16 corresponds to data stored in resistance states 1-8 when inverted.

Figure 7:
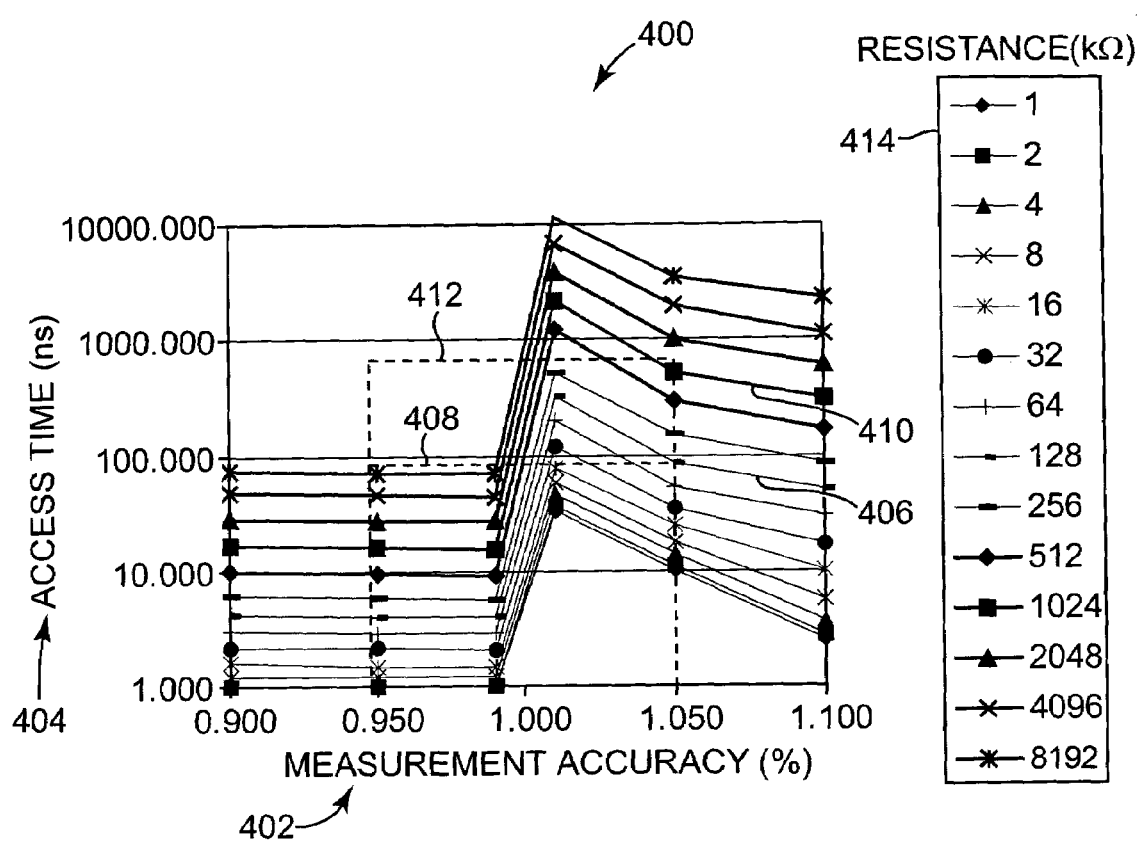
FIG. 7 is a graph illustrating one embodiment of access time versus measurement accuracy for several memory cell resistance values.

FIG. 7 is a graph 400 illustrating one embodiment of access time 404 versus measurement accuracy 402 for several memory cell resistance values 414. As illustrated in graph 400, the higher the maximum resistance state of a phase change element, the longer the access time. For example, for up to a 1 MΩ resistance state as indicated at 410, the access time is approximately 300 ns to achieve 5% accuracy as indicated at 412. For up to a 128 kΩ resistance state as indicated at 406, the access time is approximately 100 ns to achieve 5% accuracy as indicated at 408. Therefore, by using the lower half of the available resistance states of multi-bit memory cells in combination with an inverted data indicator indicating whether the data stored in an associated multi-bit memory cell or cells is inverted, access times for the multi-bit memory cells are reduced.

While the specific embodiments described herein substantially focused on using phase change memory elements, the present invention can be applied to any suitable type of resistive memory elements including a multi-bit capability.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
a first multi-bit resistive memory cell for storing a multi-bit value assigned to a resistance state of the first multi-bit resistive memory cell;
a single bit resistive memory cell for storing a bit indicating whether each bit of the multi-bit value stored in the first multi-bit resistive memory cell is inverted; and
a circuit configured to read the first multi-bit resistive memory cell and the single bit resistive memory cell and invert each bit of the multi-bit value read from the first multi-bit resistive memory cell based on the bit read from the single bit resistive memory cell.

2. The memory of claim 1, further comprising:
a second multi-bit resistive memory cell for storing a multi-bit value assigned to a resistance state of the second multi-bit resistive memory cell,
wherein the single bit resistive memory cell stores the bit indicating whether each bit of the multi-bit value stored in the second multi-bit resistive memory cell is inverted.

3. The memory of claim 2, further comprising:
a bit line coupled to the single bit resistive memory cell, the first multi-bit resistive memory cell, and the second multi-bit resistive memory cell.

4. The memory of claim 1, further comprising:
a word line coupled to the first multi-bit resistive memory cell and the single bit resistive memory cell.

5. The memory of claim 1, further comprising:
a first bit line coupled to the first multi-bit resistive memory cell; and
a second bit line coupled to the single bit resistive memory cell.

6. The memory of claim 1, wherein the first multi-bit resistive memory cell comprises a first selection device, and wherein the single bit resistive memory cell comprises a second selection device.

7. The memory of claim 1, wherein the first multi-bit resistive memory cell and the single bit resistive memory cell share a selection device.

8. The memory of claim 1, wherein the first multi-bit resistive memory cell comprises a first phase change memory cell; and
wherein the single bit resistive memory cell comprises a single bit phase change memory cell.

9. A memory comprising:
a first phase change element for storing a multi-bit value assigned to one of a plurality of resistance states of the first phase change element, the plurality of resistance states of the first phase change element including an upper half and a lower half of resistance states where the lower half of resistance states have a lower resistance than the upper half of resistance states;

a circuit configured to invert each bit of a multi-bit value assigned to a resistance state within the upper half of the resistance states such that the inverted multi-bit value corresponds to a resistance state within the lower half of the resistance states; and a second phase change element for storing one data bit indicating whether each bit of the multi-bit value stored in the first phase change element is inverted.

10. The memory of claim 9, further comprising:
a selection device coupled to the first phase change element and the second phase change element for accessing the first phase change element and the second phase change element.

11. The memory of claim 9, further comprising:
a first selection device coupled to the first phase change element for accessing the first phase change element; and a second selection device coupled to the second phase change element for accessing the second phase change element.

12. The memory of claim 11, further comprising:
a bit line coupled to the first phase change element and the second phase change element.

13. The memory of claim 12, further comprising:
a first word line coupled to the first selection device; and
a second word line coupled to the second selection device.

14. The memory of claim 11, further comprising:
a first bit line coupled to the first phase change element; and
a second bit line coupled to the second phase change element.

15. The memory of claim 14, further comprising:
a word line coupled to the first selection device and the second selection device.

16. A memory comprising:
means for determining whether a multi-bit value is assigned to a resistance state in an upper half or a lower half of resistance states of a first resistive memory element, the lower half of resistance states having a lower resistance than the upper half of resistance states;

means for inverting each bit of the multi-bit value in response to determining that the multi-bit value is assigned to a resistance state within the upper half of the resistance states;

means for storing the multi-bit value as a resistance state within the lower half of the resistance states in the first resistive memory element; and means for storing a single bit in a second resistive memory element indicating whether each bit of the multi-bit value stored in the first resistive memory element is inverted.

17. The memory of claim 16, further comprising:
a single means for selecting the first resistive memory element and the second resistive memory element.

18. The memory of claim 16, further comprising:
means for selecting the first resistive memory element; and
means for selecting the second resistive memory element.

19. The memory of claim 16, wherein the first resistive memory element comprises a first phase change element; and
wherein the second resistive memory element comprises a second phase change element.

20. A method for fabricating a memory, the method comprising:
providing a first resistive memory element for storing a multi-bit value assigned to one of a plurality of resistance states of the first resistive memory element, the plurality of resistance states of the first resistive memory element including an upper half and a lower half of resistance states where the lower half of resistance states have a lower resistance than the upper half of resistance states, wherein each bit of a multi-bit value assigned to a resistance state within the upper half of the resistance states is inverted to be stored in a resistance state within the lower half of the resistance states;

providing a second resistive memory element for storing one data bit indicating whether each bit of the multi-bit value stored in the first resistive memory element is inverted; and providing a circuit configured to read the first resistive memory element and the second resistive memory element and invert each bit of the multi-bit value read from the first resistive memory element based on the bit read from the second resistive memory element.

21. The method of claim 20, further comprising:
coupling a selection device to the first resistive memory element and the second resistive memory element for accessing the first resistive memory element and the second resistive memory element.

22. The method of claim 20, further comprising:
coupling a first selection device to the first resistive memory element for accessing the first resistive memory element; and coupling a second selection device to the second resistive memory element for accessing the second resistive memory element.

23. The method of claim 22, further comprising:
coupling a bit line to the first resistive memory element and the second resistive memory element.

24. The method of claim 23, further comprising:
coupling a first word line to the first selection device; and
coupling a second word line to the second selection device.

25. The method of claim 22, further comprising:
coupling a first bit line to the first resistive memory element; and
coupling a second bit line to the second resistive memory element.

26. The method of claim 25, further comprising:
coupling a word line to the first selection device and the second selection device.

27. The method of claim 20, wherein providing the first resistive memory element comprises providing a first phase change element; and
wherein providing the second resistive memory element comprises providing a second phase change element.

28. A method for programming a memory, the method comprising:
determining whether a multi-bit value is assigned to a resistance state within an upper half or a lower half of resistance states of a first phase change element, the lower half of resistance states having a lower resistance than the upper half of resistance states;

inverting each bit of the multi-bit value in response to determining that the multi-bit value is assigned to a resistance state within the upper half of the resistance states;

storing the multi-bit value as a resistance state within the lower half of the resistance states in the first phase change element; and storing a single bit in a second phase change element indicating whether each bit of the multi-bit value stored in the first phase change element is inverted.

29. The method of claim 28, wherein storing the multi-bit data and storing the single bit comprise selecting the first phase change element and the second phase change element using a single selection device.

30. The method of claim 28, wherein storing the multi-bit data comprises selecting the first phase change element using a first selection device, and wherein storing the single bit comprises selecting the second phase change element using a second selection device.

31. A memory comprising:
a first resistive memory element for storing a multi-bit value assigned to one of a plurality of resistance states of the first resistive memory element, the plurality of resistance states of the first resistive memory element including an upper half and a lower half of resistance states where the lower half of resistance states have a lower resistance than the upper half of resistance states, wherein each bit of a multi-bit value assigned to a resistance state within the upper half of the resistance states is inverted to be stored in a resistance state within the lower half of the resistance states;
an indicator for indicating whether each bit of the multi-bit value stored in the first resistive memory element is inverted; and
a circuit configured to read the first resistive memory element and invert each bit of the multi-bit value read from the first resistive memory element based on the indicator.

32. The memory of claim 31, wherein the indicator comprises a multi-bit phase change memory cell.

33. The memory of claim 32, further comprising:
a second resistive memory element for storing a multi-bit value assigned to one of the plurality of resistance states,
wherein the indicator individually indicates whether each bit of the multi-bit value stored in the first resistive memory element is inverted and whether each bit of the multi-bit value stored in the second resistive memory element is inverted.

34. The memory of claim 33, further comprising:
a bit line coupled to the first resistive memory element, the second resistive memory element, and the indicator.

35. The memory of claim 33, further comprising:
a first word line coupled to the first resistive memory element;
a second word line coupled to the second resistive memory element; and
a third word line coupled to the indicator.

36. The memory of claim 31, wherein the first resistive memory element comprises a first phase change element.

37. A memory comprising:
a first multi-bit resistive memory cell programmable into a plurality of resistance states each associated with a multi-bit data value;
a single bit resistive memory cell that in a first resistance state indicates that each bit of the multi-bit data value is to be used in non-inverted form and that in a second resistance state indicates that each bit of the multi-bit data value is to be used in inverted form; and
a circuit configured to read the first multi-bit resistive memory cell and the single bit resistive memory cell and invert each bit of the multi-bit data value read from the first multi-bit resistive memory cell based on the bit read from the single bit resistive memory cell.

38. An integrated circuit comprising:
a first multi-bit resistive memory cell programmable into a plurality of resistance states each associated with a first multi-bit data value and a second multi-bit data value;
a single bit resistive memory cell programmable into a first resistance state and a second resistance state, the first resistance state indicating that the first multi-bit data value is to be used and the second resistance state indicating that the second multi-bit data value is to be used; and
a circuit configured to read the first multi-bit resistive memory cell and the single bit resistive memory cell and pass the first multi-bit data value in response to the single bit resistive memory cell being programmed into the first resistance state and pass the second multi-bit data value in response to the single bit resistive memory cell being programmed into the second resistance state.

* * * * *